US005751978A

United States Patent [19]
Tipple

[11] Patent Number: 5,751,978
[45] Date of Patent: May 12, 1998

[54] MULTI-PURPOSE PERIPHERAL BUS DRIVER APPARATUS AND METHOD

[75] Inventor: David R. Tipple, Austin, Tex.

[73] Assignee: Motorola, Inc., Schaumburg, Ill.

[21] Appl. No.: 557,401

[22] Filed: Nov. 13, 1995

[51] Int. Cl.$^6$ ..................................... H03K 17/60
[52] U.S. Cl. ..................... 395/309; 395/306; 395/281; 370/570; 370/270
[58] Field of Search ............................ 395/309, 306, 395/325, 281; 327/108; 340/825; 326/81, 88; 365/189.02, 196; 370/570, 270, 24

[56] References Cited

U.S. PATENT DOCUMENTS

| | | |
|---|---|---|
| 5,396,601 | 3/1995 | Tokushige et al. . |
| 5,459,453 | 10/1995 | Minerd et al. . |
| 5,479,124 | 12/1995 | Pun et al. . |
| 5,583,454 | 12/1996 | Hawkins et al. . |

*Primary Examiner*—Jack B. Harvey
*Assistant Examiner*—Rupal D. Dharia
*Attorney, Agent, or Firm*—Craig J. Yudell

[57] ABSTRACT

An output driver (10) for a bus interface and associated method of operation. The output driver (10) comprises a first driver circuit (12), a second driver circuit (14), and a controller (16). The first driver circuit (12) provides data at a first current level to an output (18) while the second driver circuit (14) provides data to the output (18) at a second current level when activated. The controller (16), by selectively operating the first driver circuit (12) and the second driver circuit (14) causes the output driver (10) to selectively operate in differing modes of operation over time. In this fashion, the output driver (10) operates in Classical Mode (84), Active Negate Mode (80), Pulsed Negation Mode (82), and Differential Mode (86) based upon the requirements of peripheral devices (106, 108, 110, 112) and peripheral bus (20) requirements. The present invention also includes a data processing system (100) and method (150) for configuring a bus controller (102), output drivers, and/or peripheral devices (106, 108, 110, 112) on a peripheral bus (104).

21 Claims, 5 Drawing Sheets

MULTI-PURPOSE PERIPHERAL BUS DRIVER APPARATUS AND METHOD

FIELD OF THE INVENTION

This invention relates generally to driver circuits and more particularly to an output driver circuit and method of operation for driving a peripheral bus interface.

BACKGROUND OF THE INVENTION

The use of peripheral devices in conjunction with digital computers via a peripheral bus has been known in the art for years. Personal computers, as well as mainframes and workstations, generally communicate with peripheral devices such as hard disc drives, floppy disc drives, compact disc drives, optical disc drives, network interface cards, printers, tape drives, and various other components via a peripheral bus. The computer includes an interface to the peripheral bus as does each of the peripheral devices connected to the peripheral bus. Peripheral bus architectures are generally open so that manufacturers of peripheral devices may create devices that operate with a variety of computer systems in a compatible manner. Computer manufacturers also benefit from open architectures in that many peripheral devices function with the particular manufacturers' computers thereby increasing the attractiveness and utility of the computer product.

One common architecture for a peripheral bus is called the Small Computer User Interface ("SCSI") bus. In an early form, the SCSI bus was simply a parallel bus having a data width of 8 bits, operating at a frequency of 5 megahertz (MHz), and having basic control functions. However, as data transmission requirements have increased, the width of the standard SCSI data bus has doubled twice over time such that a standard SCSI data bus currently has a width of 32 bits. Initially, the data transmission operating frequency of the SCSI bus was 5 megahertz. However, some SCSI buses currently operate at clocking frequencies of up to 30 megahertz. As one skilled in the art will readily appreciate, the SCSI bus, such as other standardized bus architectures, will no doubt increase in data width as well as operating frequencies as technology advances further.

In prior art operations of a SCSI bus, a pull up resistor terminated each data line of the data bus at a source voltage level and pulled up the level of the lines of the data bus to the source voltage level when neither the host computer bus driver nor a peripheral device driver connected to the data bus was actively pulling the data lines to ground. In a "Classical Mode" of operation, data was placed on one line of the SCSI bus by selectively pulling down the data lines of the SCSI bus. Typically, data having a logic one value was represented as a low voltage on the SCSI bus while data having a logic zero value was represented as a high voltage on the SCSI bus. A major shortcoming of the Classical Mode of operation of the SCSI bus was that upon a data transition from of a low voltage to a high voltage, from a logic one to a logic zero, the voltage on the SCSI bus was pulled up to the high voltage only by the pull-up resistor (i.e., no drive voltage was provided/driven other than current flow through the pull-up). Because of the inherent capacitance of the SCSI bus, a transition from a low voltage to a high voltage took a significant amount of time thereby limiting a maximum frequency of operation of the SCSI bus.

Thus, a technique called the Active Negation Mode was developed to speed the voltage transition. In the Active Negation Mode, a device driving the SCSI bus on a transition from a low voltage level to a high voltage level pulled the voltage of the particular SCSI bus to the high voltage level to speed this transition. Active Negation thereby decreased the transition time of the SCSI bus and allowed for higher frequency of operation of the SCSI bus.

Operation of the SCSI bus in "Differential Mode" also increased a maximum speed of operation of the SCSI bus. In the Differential Mode, each data bit transmitted on the SCSI bus required two data lines, the lines operating at complementary voltages, typically a source voltage and ground. As one skilled in the art will appreciate, the differential SCSI bus was driven by asserting a positive voltage on one line and a grounding the complementary line. However, in some systems, one line was driven with a positive voltage while the complementary line was driven with a negative voltage of an equal magnitude. Systems employing the Differential Mode of operation not only could operate at higher frequencies but could drive longer SCSI buses since the differential signal provided greater noise margins.

Unfortunately, consistency is required in the operation of peripheral buses. When operating the peripheral bus in a particular Mode, each device on the peripheral bus must be operating in the particular mode. For example, if the host computer system bus driver drove the bus only in the Classical Mode, peripheral devices operating in the Differential Mode could not be used with the host computer system. Further, even if the host computer bus driver and the peripheral device bus drivers all were single ended in configuration, the devices had to run in a particular mode of operation. In order for the benefits relating to a faster mode of operation to be obtained, every peripheral device needing the faster mode of operation needs to be updated. Unfortunately, the prior devices only operated in a single mode and had to be purchased for a particular installation to achieve maximum benefits. Therefore, flexibility and interconnectivity of various devices was reduced. For one product to work on several platforms, several derivatives of the product needed to be designed. In order to change operational modes, whole peripherals would need to be physically replaced with a derivative product having the new operational mode. These problems/limitations were expensive, greatly limited the design choice of system designers, and made upgrades of systems over time difficult to achieve effectively.

Thus there is a need in the art for driving a peripheral bus that takes advantages of many available modes of operation and may operate in the variety of modes of operation in a dynamic and cost effective manner.

DETAILED DESCRIPTION OF THE DRAWINGS

The present invention relates to an output driver for a bus interface and an associated method of operation. Preferably the output driver includes a first driver circuits, a second driver circuit and a controller. The first driver circuit drives at a first current level when operating and the second driver circuit drives at a second current level when activated. The controller provides control signals to the first driver and second driver circuit to enable the driver circuits for particular modes of operation which are selectable. Based upon the control signals, the first driver circuit and second driver circuit provide data at an output in the Classical Mode, the Active Negation Mode, a Pulsed Negation Mode, and in the Differential Mode which greatly increases peripheral flexibility and cost savings.

Figure 1:
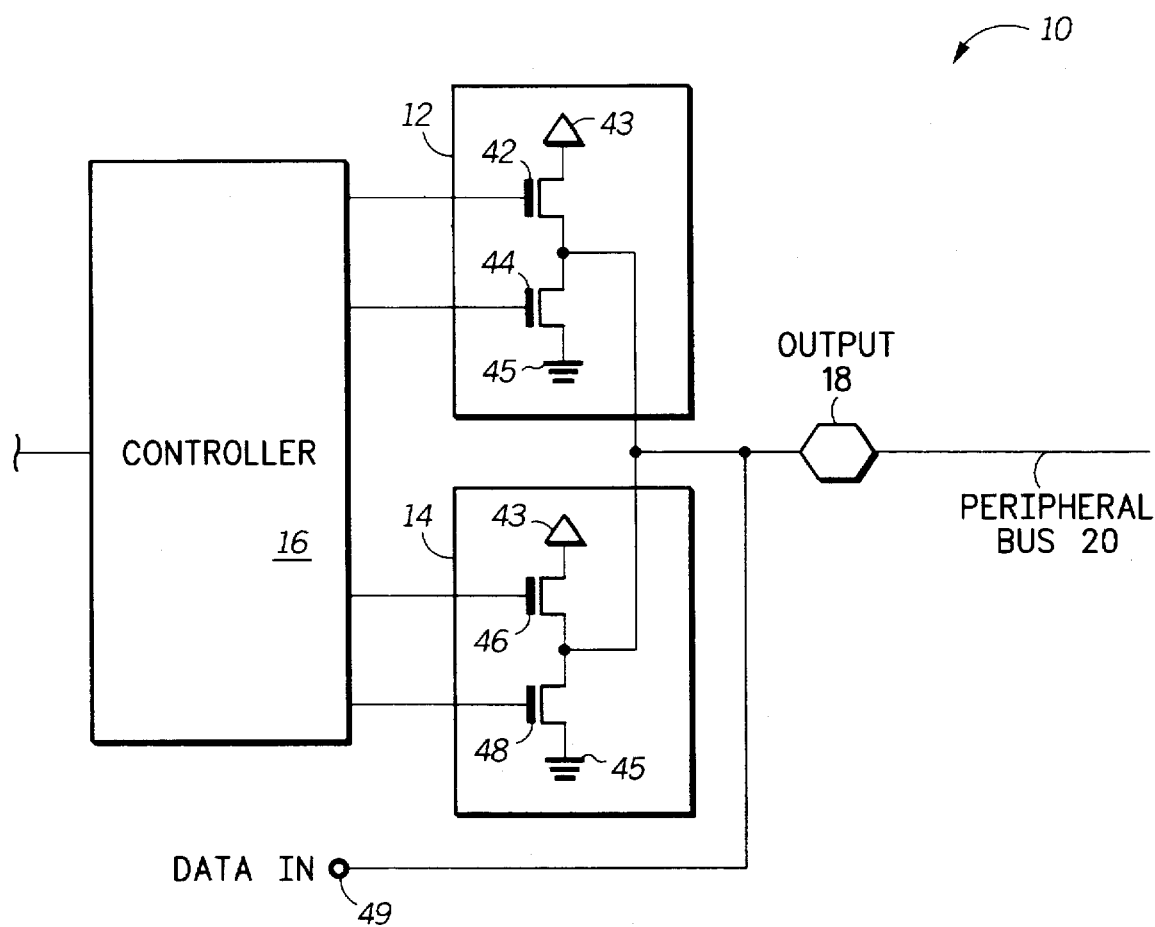
FIG. 1 is a block diagram illustrating an output driver for a bus interface in accordance with the present invention.

FIG. 1 illustrates an output driver 10 for a bus interface that comprises a first driver circuit 12, a second driver circuit 14, and a controller 16. The first driver circuit 12 includes a first transistor 42 operably coupled between a first power supply 43 and an output 18 of the output driver 10. The first driver circuit 12 also includes a second transistor 44 operably coupled between a second power supply 45 and the output 18 of the output driver 10. Preferably, the first power supply 43 comprises a source voltage $V_{dd}$ associated with the integrated circuit in which the output driver is implemented. Further, the second power supply preferably comprises a reference ground associated with the integrated circuit in which the output driver 10 is implemented.

The second driver circuit 14 comprises a first transistor 46 operably coupled between the first power supply 43 and the output 18 of the output driver 10. Further, the second driver circuit 14 comprises a second transistor 48 operably coupled between the second power supply 45 and the output 18 of the output driver 10. Thus, the first driver circuit 12 and second driver circuit 14 are essentially connected in parallel with one another to provide output to the output 18 of the output driver circuit 10. Preferably, the output 18 comprises a pad that physically connects to a peripheral bus line 20 of a peripheral bus. Of course, as one skilled in the art will readily appreciate, an identical circuit will be required for each line 20 of the peripheral bus. It is important to note that the power supplies 43 for each driver 12 and 14 are typically the same voltage or power supply source. However, each driver may be driven by a different power supply voltage which is different in origin and/or magnitude.

The controller 16 operably couples to the first transistor 42 and the second transistor 44 of the first driver circuit 12 and provides gating signals to the first transistor 42 and the second transistor 44. The controller 16 also operably couples to the first transistor 46 and the second transistor 48 of the second driver circuit 14 and provides gating signals to the first transistor 46 and the second transistor 48. The control signals provided by the controller 16 are determined based upon a mode of operation of the output driver 10 and data to be applied to the output 18 of the output driver 10. For example, when the output driver 10 operates in the Active Negation Mode, the first transistor 42 of the first driver circuit 12 and the first transistor of the second driver circuit 14 may operate. However, in the Classical Mode of operation, the controller 16 will not provide control signals to the first transistor 42 of the first driver circuit 12 and the first transistor of the second driver circuit 14 and the transistors will not operate. The modes of operation of the output driver 10 of the present invention will be discussed in more detail hereinafter.

Data is received from the peripheral bus 20 through the output 18 of the driver circuit and provided at an input port 49 as Data In 49. In accordance with the teachings of the present invention, the output driver 10 operates not only to drive the peripheral bus 20 but to provide a connection for the receipt of Data In 49. Since the additional circuitry is not germane to the present invention, unless pertinent to the present invention, it will not be further discussed herein.

In a preferred embodiment of the output driver 10 of FIG. 1, the first transistor 42 and second transistor 44 of the first driver circuit 12 provide a current level differing from the current level provided by the first transistor 46 and second transistor 48 of the second driver circuit 14. In operation, the peripheral bus 20 requires a higher current level during a single ended mode of operation than it does during a Differential Mode of operation. Preferably, the first driver circuit 12 provides a drive current of 48 milliamps (mA) while the second driver circuit 14 provides a drive current level of 2 milliamps (mA). In this manner, the output driver circuit 10 of FIG. 1 may be used to drive a peripheral bus in both a single ended mode of operation and a Differential Mode of operation.

In accordance with the present invention, the controller 16 may be programmed to drive the first driver circuit 12 and second driver circuit 14 in the Active Negation Mode, a Pulsed Negation Mode, the Classical Mode, and Differential Mode. Thus, the output driver 10 provides the important benefit of operating in any of the desired modes. While prior devices operated in only a single mode, the present invention operates in the enhanced modes without requiring the alteration of hardware. Thus, the output driver 10 provides greater flexibility with an overall reduction in hardware requirements.

The output driver circuit 10 will preferably be included as a component within larger integrated circuit that has additional functions. In this fashion, the output driver 10 of the present invention allows larger integrated circuit to communicate in any of the various modes of operation of a peripheral bus without additional hardware requirements.

Preferably, each of the transistors connecting to the output 18 are N-channel transistors. The benefit of using N-channel transistors to provide the output 18 to the peripheral bus 20 relates to the receipt of data at the output 18 during the power-down state of the controller. If P-channel transistors were used instead of N-channel transistors, the P-doped drain of the P-channel transistor would be biased at a positive voltage by the peripheral bus 20 pull-up resistor. The positive voltage would be applied across the P-N drain to substrate junction and power up the substrate of the device in which the bus controller 10 is included. However, when using of the N-channel transistors in the driver output, the N-doped drain of the output transistors couple to the output 18 of the bus controller, thus preventing a powerup of the substrate.

Figure 2:
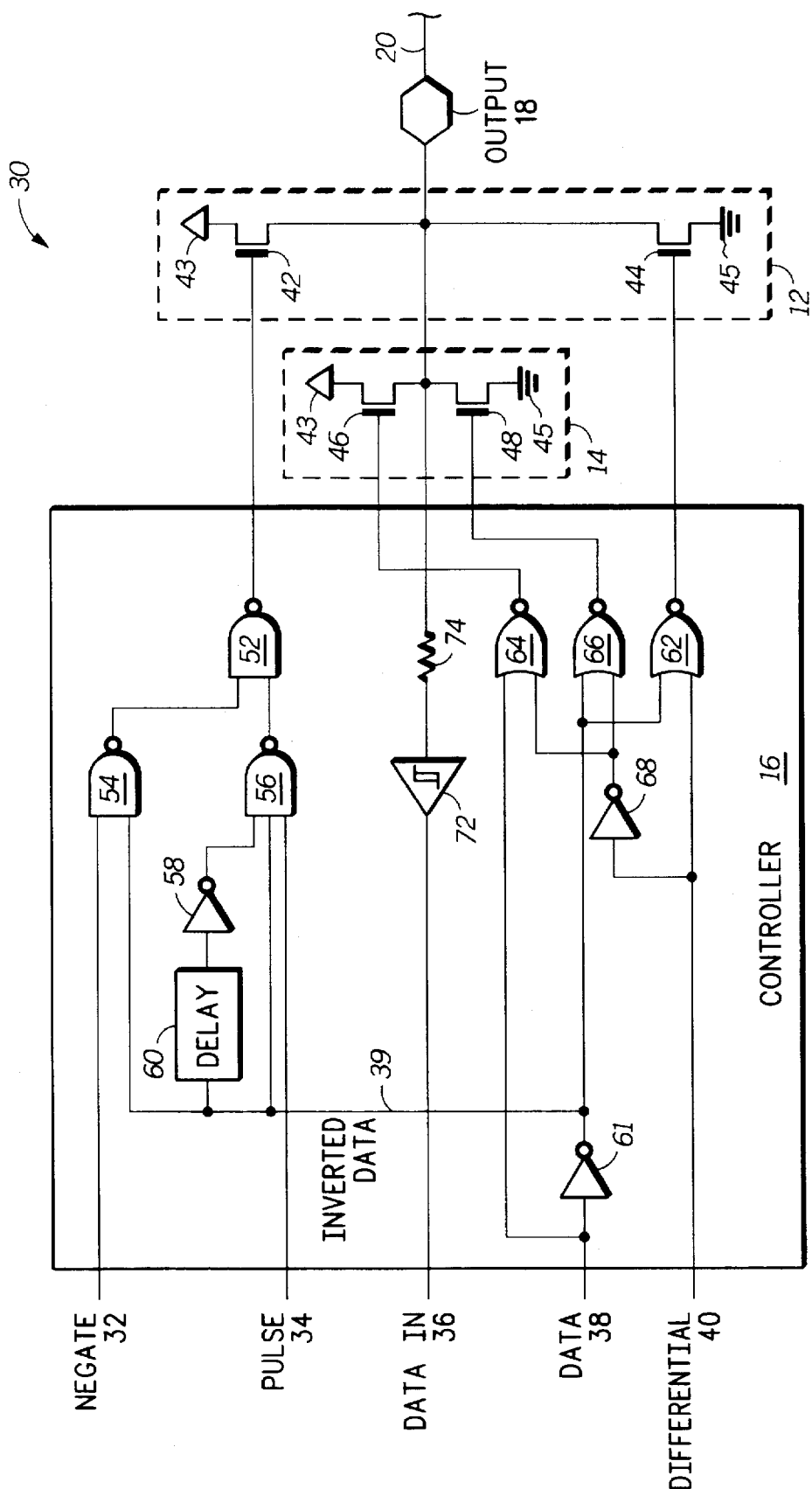
FIG. 2 is a schematic diagram of an output driver for a bus interface detailing a first driver circuit, a second driver circuit, and a controller.

FIG. 2 illustrates an output driver circuit 30 for a bus interface shown in more detail than the output driver circuit 10 of FIG. 1. The output driver 30 preferably includes a first output driver 12, a second output driver 14, and controller 16. The first output driver 12 preferably includes a first N-channel transistor 42 and a second N-channel transistor 44. Preferably the first N-channel transistor 42 couples between a first voltage supply 43 and an output 18 of the output driver circuit 30. The second transistor 44 of the first output driver 12 also comprises an N-channel transistor coupled between the output 18 of the output driver circuit 30 and a second power supply 45.

Preferably, the second power supply 45 is at reference ground while the first power supply 43 is at a source voltage selected to operate with a particular peripheral architecture and specification. A typical operating voltage of a SCSI bus is 5 volts and, when the output driver 30 is applied to a SCSI application, the first power supply 43 is at 5 volts. When the first transistor 42 is enabled, it pulls the output 18 of the output driver 30 to the level of the first power supply 43. However, when the second N-channel transistor 44 is enabled, it pulls the output 18 of the output driver circuit 30 to the second power supply 45, preferably a reference ground.

The second output driver 14 preferably comprises a first N-channel transistor 46 and a second N-channel transistor 48. The first N-channel transistor connects between the first power supply 43 and the output 18 of the output driver circuit 30. In this fashion, when the first N-channel transistor 46 is enabled, it pulls the voltage at the output 18 up to the first power supply 43. The second N-channel transistor 48 couples between the output 18 and the output driver 30 and the second power supply. Thus, when enabled, the second N-channel transistor 48 pulls the output 18 of the output driver 30 to the reference ground.

Preferably, the first N-channel transistor 42 and the second N-channel transistor 44 of the first driver circuit 12 differ in size from the first N-channel transistor 46 and the second N-channel transistor 48 of the second driver circuit 14. In this fashion, when activated, the first driver circuit 12 and the second driver circuit 14 provide signals to the peripheral bus 20 at differing current levels. As was previously discussed, by selectively operating the first driver circuit 12 and second driver circuit 14, the output driver 10 may operate in differing modes to provide a desired current drive level to the peripheral bus 20.

The controller 16 in one embodiment includes a first nand gate 52, second nand gate 54, a third nand gate 56, inverter 58, delay circuit 60, inverter 61, nor gate 62, nor gate 64, nor gate 66, and inverter 68. These components function to provide the correct control signals to the first driver circuit 14 and second driver circuit 12. The operation of these components will be discussed in more detail in conjunction with FIG. 3. As one skilled in the art will readily appreciate, the control signals provided by the controller 16 could be generated in various manners and the implementation shown in FIG. 2 is simply a preferred embodiment.

For the receipt of data from the peripheral bus 20, the controller 16 includes a resistor 74 and schmidt trigger 72 and provides Data In 36. As one skilled in the art will readily appreciate, circuitry for producing Data In 36 need not be included in the controller 16. Nonetheless, the embodiment illustrated in FIG. 2 provides Data In 36 from the peripheral bus 20, through the controller 16, and to a device operably connected to the controller 16 to receive the Data In 36. The invention taught herein may be used to make both output buffers and input/output (I/O) buffers.

Control signals that must be provided to the controller 16 include NEGATE 32, PULSE 34 and DIFFERENTIAL 40. The assertion of these signals causes the controller 16 to operate in a particular mode of operation. In accordance with the embodiment of FIG. 2, only one of the three signals, NEGATE 32, PULSE 34, and DIFFERENTIAL 40 may be asserted high at any time to avoid conflicts. However, all three of the signals NEGATE 32, PULSE 34 and DIFFERENTIAL 40 are held logic low to enable the Classical or Single Ended Mode of operation. Preferably, the control signals are provided by a host computer, central processing unit (CPU), or another portion of an integrated circuit in which the output driver 10 resides.

The controller 16 preferably operates in one of four separate modes. The first mode of operation of the controller is the Active Negation Mode. The second mode of operation of the controller, which is novel in itself, is the Pulsed Negation Mode. The third mode of operation is the Single-Ended or Classical Mode. Finally, the fourth mode of operation is the Differential Mode. Each of these particular modes will be discussed in more detail in conjunction with FIG. 3.

Figure 3:
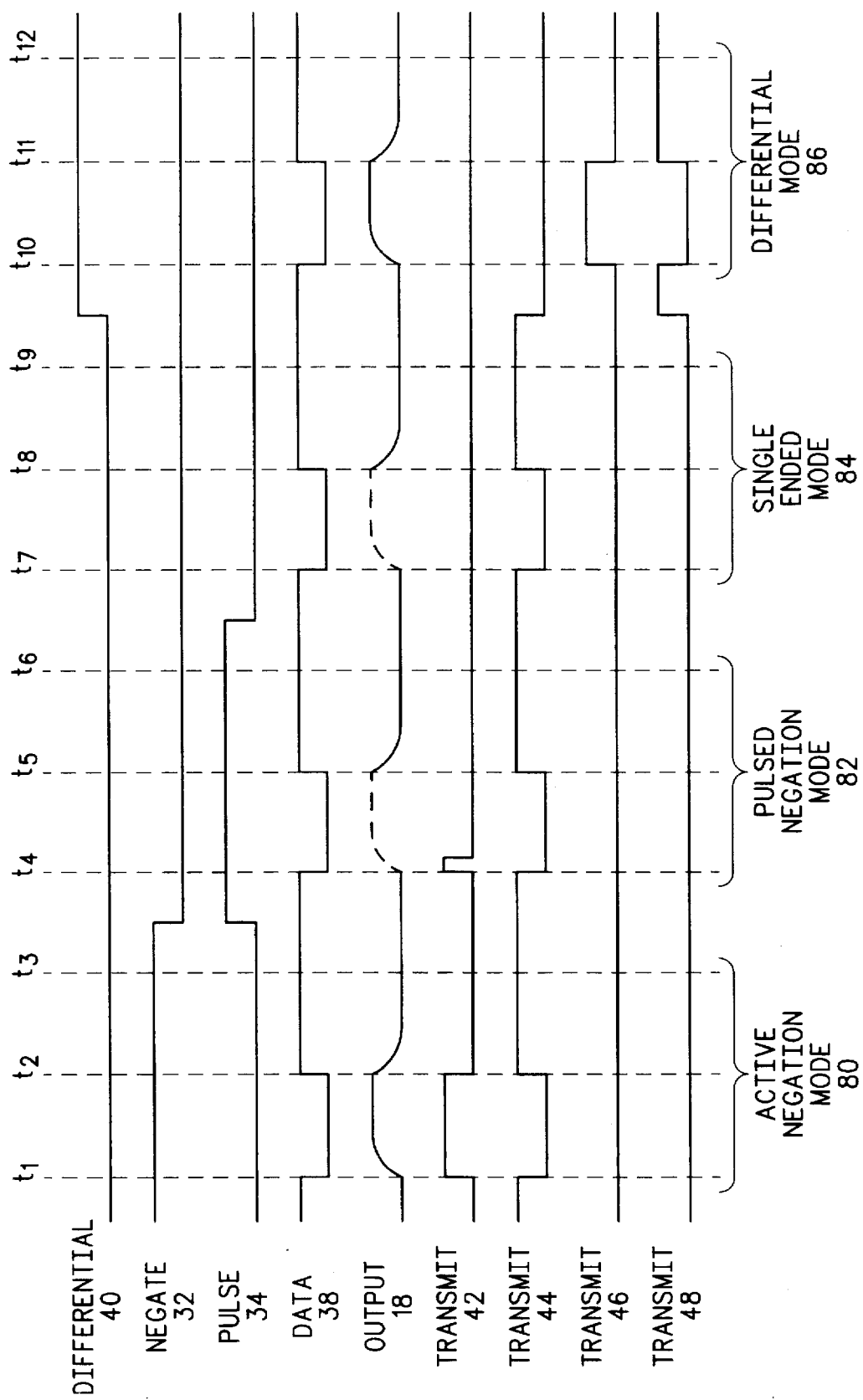
FIG. 3 is a signal transition diagram illustrating modes of operation available in conjunction with the output driver circuit of FIG. 1.

FIG. 3 is a signal transition diagram relating to the operation of the circuit of FIG. 2. Referring to FIGS. 2 and 3, at time $t_1$, the state of the control inputs is as follows: DIFFERENTIAL 40 is low (logic zero or 0 volts), NEGATE 32 is high (logic one or a voltage above 0 volts), and PULSE 34 is low. With these control inputs, the output driver 30 is in the Active Negation Mode 80 wherein active negation of the output 18 of the output driver 30 is provided. When DIFFERENTIAL 40 is low, both nor gate 64 and 66 have their outputs forced low. In this fashion, both transistor 46 and transistor 48 are turned off whenever DIFFERENTIAL 40 is low, independent of the status of DATA 38. Further, when both NEGATE 32 and PULSE 34 are low, transistor 42 will be off, independent of the status of DATA 38.

If two of the three control inputs are enabled, the output driver 30 will not operate in any desired mode but will operate incorrectly. As one skilled in the art will readily appreciate, NEGATE 32, PULSE 34, and DIFFERENTIAL 40 must be selectively enabled and disabled to cause the output driver 30 to operate correctly in a desired mode. However, the present invention may be practiced such that transistors 46 and 42 or transistors 48 and 44 operate simultaneously to generate enhanced current drive in particular modes. Also, priority encoding or like logic may be added to the circuitry of FIG. 2 to ensure that when two of the three control inputs are enabled that one overrides the other for proper operation. Also, the control signals may in another embodiment be encoded so that when two of the three control input lines are enabled an additional fifth mode of operation (or more) can be performed.

Prior to time $t_1$, DATA 38 is high. Thus, because INVERTED DATA 39 is provided to nand gate 54 and nand gate 56, the outputs of both nand gate 54 and nand gate 56 are high. Resultantly, the output of nand gate 52 is low and transistor 42 is turned off. Since the output of nor gate 62 is high, transistor 44 is turned on and the output 18 is low, or at a ground level. Thus, in the Active Negation 80 Mode of operation, when the DATA 38 is high, the output 18 voltage is held low.

At time $t_1$ when DATA 38 transitions from high to low, INVERTED DATA 39 applied to nand gates 54 and 56 transitions from low to high. Previously, the outputs of both nand gate 54 and nand gate 56 had been high thus causing the output of nand gate 52 to be low. However, when DATA 38 goes from high to low it causes the output of nand gate 54 to go from high to low thus causing the output of nand gate 52 to go from low to high, turning on transistor 42. With the transition of transistor 42 from off to on, the transistor attempts to pull the output voltage 18 to the level of the first power supply 43. Because of the inherent capacitance in the peripheral bus interface line, however, the voltage at output 18 ramps up to the first power supply voltage 43.

At time $t_2$, DATA 38 transitions from low to high. This transition has the inverse effect of the low to high transition previously described. The transition causes the output of nand gate 54 to go from low to high and causes the output of nand gate 52 to go low, thus turning off transistor 42. Further, this transition causes the output of nor gate 62 to go from low to high, turning on transistor 44. The voltage on the output 18 therefore is pulled down to the second power supply 45 level. However, because of the capacitance in the peripheral bus 20, the output voltage 18 ramps down to the voltage of the second power supply 45 over time accordance with the time constant of the peripheral bus 20 line.

Therefore, in the Active Negation 80 Mode of operation, transistor 42 is used to pull up the voltage at the output 18. In this fashion, the delay in signal transitions on peripheral bus 20 from low to high is decreased. Because the signal transition time decreases, the frequency of operation of the peripheral bus 20 increases. As one skilled in the art will readily appreciate, the increase in frequency of operation available during the Active Negation Mode 80 allows more data to be passed back and forth across the peripheral bus 20 and provide greater performance.

Between time periods $t_3$ and $t_4$, the mode of operation is shifted from the Active Negation 80 Mode to the Pulsed Negation 82 Mode by transitioning NEGATE 32 from high to low and transitioning PULSE 34 from low to high. Prior to time $t_4$, the transition of NEGATE 32 and PULSE 34 do not alter the output of nand gate 52 and, resultantly, transistor 42 remains off while transistor 44 remains on.

At time $t_4$, DATA 38 transitions from high to low, and resultantly, INVERTED DATA 39 transitions from low to high. Thus, the output of nand gate 56 transitions from a high to low, causes the output of nand gate 52 to transition from low to high and turns on transistor 42 pulling the output 18 voltage to the first source 43 level. Simultaneously, delay element 60 delays INVERTED DATA 39, preferably for 2 to 5 nanoseconds and then provides the INVERTED DATA 39 to inverter 58. Inverter 58 inverts the delayed INVERTED DATA 39 and transmits the delayed and INVERTED DATA to nand gate 56 thus causing the output of nand gate 56 to transition from low to a high. Upon the transition of nand gate 56 from low to high, nand gate 52 transitions from high to low thus turning off transistor 42. Thus, at output 18, a high voltage pulse has been provided that helps to pull the voltage on the peripheral bus 20 high.

As opposed to the Classical, or Single Ended Mode of operation, in the Pulsed Negation 82 Mode of operation, the output driver 30 assists the pull-up resistor in transitioning the peripheral bus 20 from a low voltage to a high voltage. However, the output driver 30 does not actively negate the peripheral bus 20 as it does in the Active Negation 80 Mode. In the Pulsed Negation 82 Mode of operation, the output driver 30 allows the peripheral bus 30 to be operated at higher frequencies without full active negation. Because it does not provide full active negation, the Pulsed Negation 82 Mode may be used in situations where full active negation may not be used but where enhanced frequency of operation is desired.

Between times $t_6$ and $t_7$, the mode of operation changes from the Pulsed Negation Mode 82 to a Single Ended Mode 84 (Classical Mode). To enable the Single Ended Mode 84, PULSE 34 transitions from high to low, NEGATE 32 remains low, and DIFFERENTIAL 40 remains low. Because DATA 38 remains high between times $t_6$ and $t_7$, the transistors 42, 44, 46, and 48 remain in the same state of operation.

During the transition at time $t_7$, DATA 38 goes from high to low causing INVERTED DATA 39 to go from low to high, causing the output of nor gate 62 to go from high to low. Therefore, transistor 44 turns off, the output 18 is allowed to float and the pull-up resistor on the peripheral bus 20 transitions the output 18 voltage from low to high. As it has been previously described, the single ended 84 mode is slower to transition from low to high than either the Active Negation 80 Mode or the Pulsed Negation 82 Mode. Thus, the highest frequency of operation possible in the Single Ended 84 Mode is less than the Pulsed Negation 82 Mode and the Active Negation Mode 80.

At time $t_8$, the output driver 30 remains in single ended 84 Mode and DATA 38 transitions from low to high. At this point, the INVERTED DATA signal 39 provided as input to nor gate 62 transitions from high to low and turns on transistor 44. Transistor 44 then pulls the voltage at the output 18 to the level of the second power supply 45.

Between times $t_9$ and $t_{10}$, DIFFERENTIAL 40 transitions from low to high, thus placing the output driver 30 in the differential 86 Mode from the Single Ended 84 Mode. When this transition occurs, the input DIFFERENTIAL 40 to nor gate 62 drives the output of nor gate 62 and turns off transistor 44. However, the transition also causes the output of nor gate 66 to go from low to high thus turning on transistor 48. The output of nor gate 64 remains low thus keeping transistor 46 turned off. In an alternative preferred mode of the invention, transistor 48 pulls the output 18 to a negative voltage level. As one skilled in the art will readily appreciate, then, the output driver 30 could be used as one portion of a circuit driving a peripheral bus 20 in Differential Mode with an identical circuit driving a second portion of the peripheral bus.

While DIFFERENTIAL 40 remains high, nor gate 62 output remains low, thus preventing transistor 44 from driving the bus. Further, with NEGATE 32 and PULSE 34 both low, transistor 42 remains off. Thus, because transistors 42 and 44 have a higher current drive capacity than transistors 46 and 48, during differential 86 Mode, the peripheral bus 20 is driven at a lower current level.

At time $t_{10}$, DATA 38 transitions from high to low. The transition of DATA 38 from high to low causes the output of nor gate 66 to transition from high to low, turning off transistor 48. The transition also causes INVERTED DATA 39 to go from low to high thus transitioning the output of nor gate 64 from low to high, turning transistor 46 on. Resultantly, the voltage at the output 18 at the output driver circuit 30 is pulled to high. As was previously discussed, due to the capacitance in the peripheral bus 20, the voltage ramps up over a period of time to a high level.

At time $t_{11}$, DATA 38 transitions from low to high. The transition in the DATA 38 causes the output of nor gate 64 and nor gate 66 to transition as well, turning off transistor 46 and turning on transistor 48. Thus, the voltage at the output 18 of the output driver circuit 30 transitions from high to low.

Thus, in accordance with the present invention, the output driver 30 drives the peripheral bus in four different modes with the same circuitry. Thus, the present invention provides the important benefits of flexible operation with a single circuit as well as overall cost reductions because of fewer requisite variations in needed peripheral bus 20 drivers.

Preferably, the output driver circuit 30 further includes a differential output connection that operably couples the output driver 30 to a differential driver circuit (not shown). The differential output connection connects so that data is provided on two outputs in response to the DATA 38 received at the controller 16. As one skilled in the art will readily appreciate, the control signals provided by the controller 16 could be used to drive an identical driver circuit 30 that would provide the complementary side of a differential driver. In this fashion, both ends of the differential circuit would be provided to the bus 20.

Figure 4:
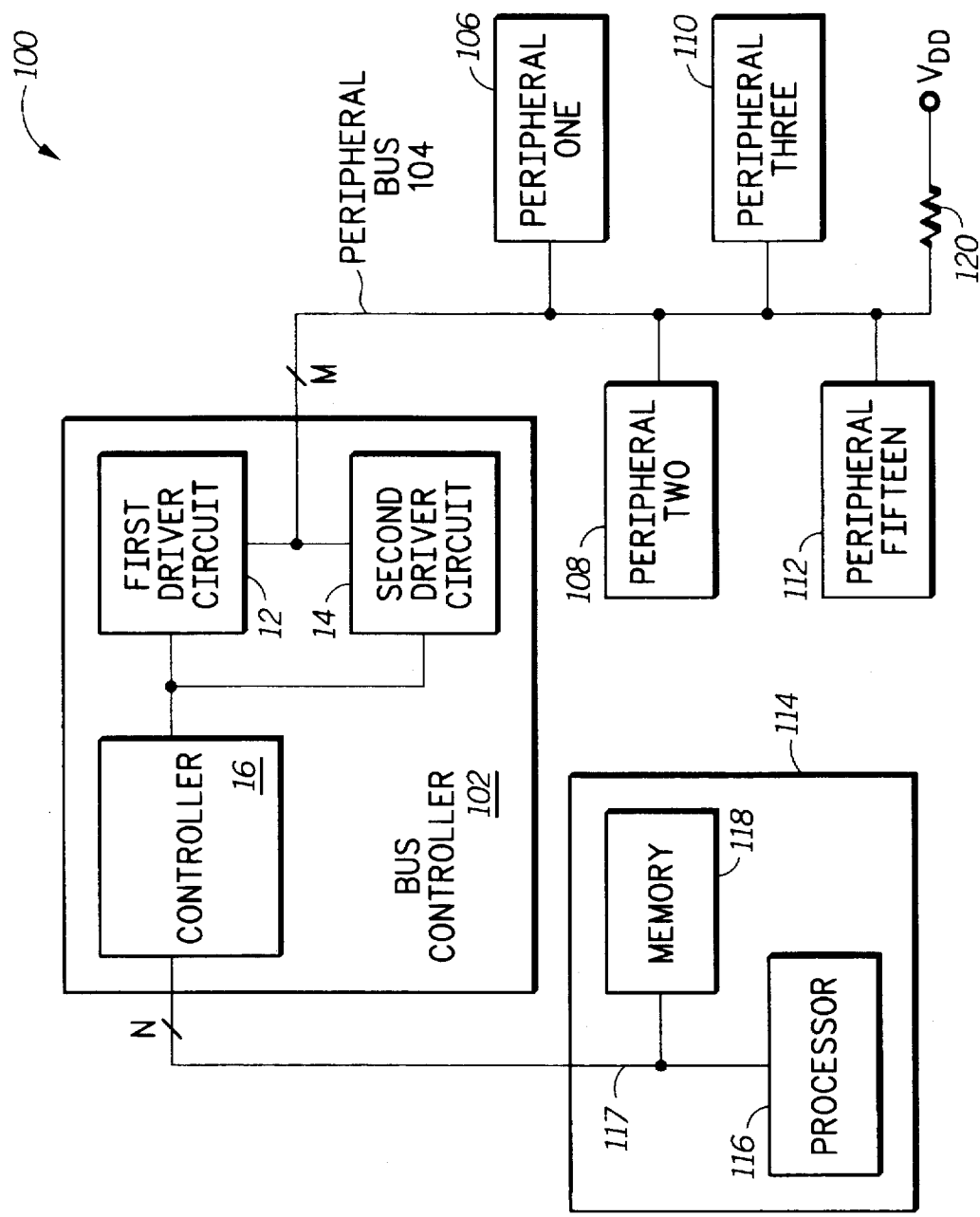
FIG. 4 is a block diagram illustrating a data processing system in accordance with the present invention.

FIG. 4 illustrates a data processing system 100 comprising a bus controller 102, a bus 104 operably coupled to the bus controller, and at least one peripheral device 106 through 112 operably coupled with the bus. Preferably, the data processing system 100 further comprises a process unit 114, including a processor 116, processor bus 117 operably coupled to the processor 116, the bus controller 102 and, a memory 118.

The bus controller 102 preferably comprises a first driver circuit 12, a second driver circuit 14, and a controller 16. The particular components of the bus controller 102 have been previously described in conjunction with FIGS. 1 and 2 and will not be further described in detail with reference to FIG. 4.

Bus 104 operably couples to the bus controller 102 and preferably comprises a peripheral bus 104 having a width of M bits, the width sufficient to provide a required performance. As was previously discussed, standard data widths for peripheral buses range from 8 bits up to 32 bits of data along with associated control lines depending on the particular application. However, the data width of the peripheral bus 104 is not limited herein and the teachings of the present invention may be adapted to any width of peripheral 104 bus that may be designed in the future. While a preferred architecture of the peripheral bus 104 is the SCSI architecture, any type of peripheral bus known in the art could be used with the teachings of the present invention. As was previously discussed, in accordance with architectures known, a pull-up resistor 120 passively pulls up the voltage on the bus 104 to an operational denoted as $V_{dd}$ in FIG. 4. However, the pull-up resistor 120 may be actively switched to pull-up the voltage on the bus 104 based upon a sense voltage on the bus 104. As is known in the art, active switching or pulling up of the bus 104 may be performed by using active control circuitry.

The peripheral devices 106 through 112 operably couple to the bus 104 and communicate with the bus controller 102 over the peripheral bus 104 through the output driver of the bus controller 102. Preferably, the peripheral devices are selected from the group consisting of a compact disc drive, a floppy disc drive, memory expansion board, video card, modem, fax machine, a hard disc drive, a serial bus interface, a parallel bus interface, printer, tape drive, optical disc drive or compact disc (CD) drive, and any like peripheral. The types of peripheral devices that could be coupled to the bus 104 may include additional devices not described herein. Further, the number of devices that could connect to the bus 104 are not limited by the principles of the present invention.

The processor bus 117, preferably comprises a standard construction having a bus width N such that the processor 116 and the memory 118 operate in conjunction with the bus controller 102 to communicate with the peripheral devises 106, 108, 110, and 112. Preferably, the processor 116 causes the bus controller 102 to operate amongst the various modes of operation previously described herein.

Thus, the data processing system illustrated in FIG. 4 provides the important benefit of allowing a processor 116 to communicate across a peripheral bus 104 with peripheral devices in any of a number of various modes of operation. Simply by issuing software instructions to the bus controller 102 over the system bus 117, the mode of operation of the bus controller 102 may be altered to communicate with particular peripheral devices. Depending upon the particular mode of operation selected, the data rate at which data may be passed over the bus peripheral 104 is increased or decreased based upon the types of peripherals connected to the peripheral bus 104. In accordance with the teachings of the present invention, the bus controller 102 may automatically alter its mode of operation to most advantageously operate the peripheral bus 104 to take advantage of the available modes of operation of the peripheral devices attached to the bus 104.

For example, if peripheral device 106 operates only in the Single Ended Mode, the bus controller 102 would operate in the Single Ended Mode in conjunction with peripheral device 106. However, if peripheral device 112 operates in Active Negation Mode, the bus controller 102 may switch to the Active Negation Mode when communicating with peripheral device 112. Thus, the data transfer rate across the bus 104 will increase when peripheral device 112 communicates with bus controller 102.

Further, if the peripheral bus 104 is a differential bus, the bus controller 102 may configure itself to communicate across the peripheral bus 104 in a Differential Mode. Thus, even though the bus 104 would be of a different construction, the bus controller 102 could switch to the mode of operation required by the particular bus structure.

Figure 5:
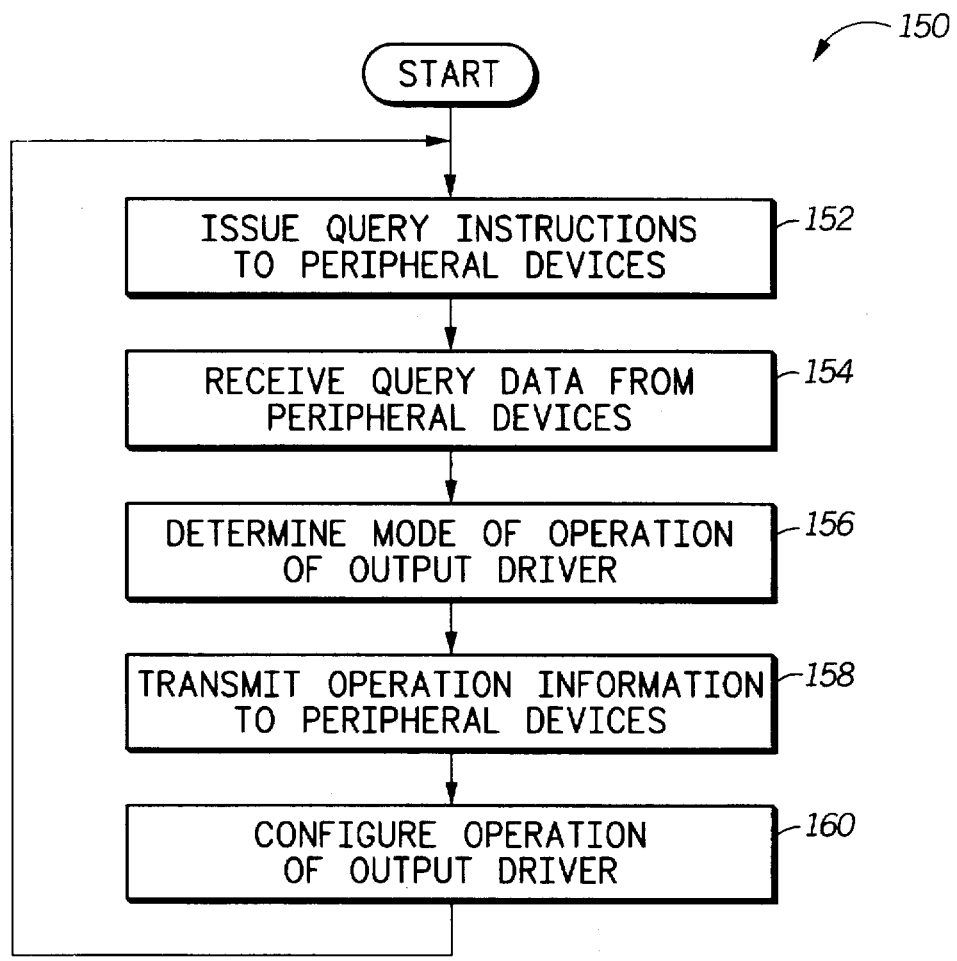
FIG. 5 is a logic diagram illustrating a method for configuring an output driver for a bus interface in accordance with the present invention.

FIG. 5 illustrates a method 150 for configuring an output driver bus interface. The method commences at step 152 which includes issuing query instructions to at least one peripheral device and connects it to the bus interface over a peripheral bus. As was previously described in conjunction with FIG. 4, various peripheral devices will be connected to the bus interface over the peripheral bus. Each of these particular peripheral devices may be capable of operating in only one particular mode of operation.

Based upon the query instructions issued to the peripheral devices, the method proceeds to step 154 of receiving query data from the peripheral devices. The query data includes configuration information for at least one of the peripheral devices. Preferably, query data is received from each particular peripheral device connected to the bus interface over the peripheral bus.

From Step 154, the method proceeds Step 156 of determining a mode of operation of the output driver based upon the query data. This determination may include operating in a different mode for each of the peripheral devices connected to the bus interface over the peripheral bus or may include operating in the same mode with all of the peripheral devices. By varying the mode of operation for each particular peripheral device, the overall frequency of data interchange between the bus interface and the peripheral devices will be optimized.

Next, at Step 158, the method 150 includes transmitting operation information to the peripheral devices wherein the operation information configures the peripheral devices to operate in particular modes of operation. The configuration information provided via step 158 includes configuring the peripheral only if the peripheral may be configured by instructions over the peripheral bus. Therefore, step 158 does not include configuring non-configurable devices. However, step 158 does include configuring the peripheral devices to operate in as expeditious a manner as possible to maximize the possible data transfer rate across the peripheral bus.

Next, at Step 160, the method includes configuring the operation of the output driver to function in a particular operational mode. A first possible mode of the output driver is the Active Negation Mode, a second mode is the Pulsed Negation Mode, a third mode is the Single Ended or Classical Mode, and a fourth mode is the Differential Mode. These particular modes of operation have been described in conjunction with FIGS. 2 and 3 and will not be described herein further. However, the teachings of the present invention are not limited by the modes disclosed as the teachings of the present invention could apply to additional modes as well.

Thus, the method of FIG. 5 provides the important benefits of optimizing the data transmission operations of a peripheral bus interface used in conjunction with a peripheral bus. By selectively configuring the operation of the output driver to function in one of the operational modes, the data transfer rate between the bus interface and the peripheral devices over the peripheral bus are maximized. Thus, a single bus interface may be used with various architectures and operational characteristics of peripheral devices.

While the present invention has been disclosed in connection with the preferred embodiment thereof, it should be understood that there may be other embodiments which fall within the spirit and scope of the invention as defined by the following claims. For example, it is important to note that FIG. 1 illustrates two driver circuits 12 and 14. However, the circuit of FIG. 1 may contain three, four, or N drivers wherein N is a finite positive integer greater than one. It should be also noted that the transistors 42 and 46 of FIG. 1 can be manufactured as P channel transistors in an isolated well in another embodiment.

What is claimed is:

1. An output driver for a bus interface, the output driver comprising:

a first driver circuit, wherein the first driver circuit includes a first transistor operably coupled between a first power supply and an output of the output driver, and wherein the first driver circuit includes a second transistor operably coupled between a second power supply and the output of the output driver, the first driver circuit selectively providing output data to the output of the output driver where the output data has a first current drive;

a second driver circuit, wherein the second driver circuit includes a first transistor operably coupled between the first power supply and the output of the output driver, and wherein the second driver circuit includes a second transistor operably coupled between the second power supply and the output of the output driver the second driver circuit selectively providing output data to the output of the output driver where the output data has a second current drive different from the first current drive; and a controller operably coupled to the first driver circuit and the second driver circuit, wherein the controller receives control signals and data signals which control the operation of the first driver circuit and the second driver circuit so that one of either the first driver circuit or the second driver circuit is enabled to provide the output data, wherein the controller includes circuitry for mutually exclusively enabling the first driver circuit and the second driver circuit.

2. The output driver of claim 1, wherein the first driver circuit comprises transistors that provide data at the first current drive when enabled, wherein the second driver circuit comprises transistors that provide data at the second current drive when enabled, and wherein the first current drive is different from the second current drive to provide for selectable compatibility with peripheral devices.

3. The output driver of claim 1, wherein the controller includes circuitry for causing the first driver circuit to provide data at a first current level when the second driver circuit is disabled, and wherein the circuitry causes the first driver circuit and the second driver circuit together to provide data at a second current level when the second driver circuit is enabled.

4. The output driver of claim 1, wherein the first driver circuit, the second driver circuit, and the controller include connections for operating with a small computer systems interface (SCSI) bus.

5. The output driver of claim 1:

wherein the first transistor and second transistor of the first driver circuit each comprise N-channel transistor to prevent a reverse biasing of the transistors when disabled; and wherein the first transistor and second transistor of the second driver circuit each comprise N-channel transistors to prevent a reverse biasing of the transistors when disabled.

6. The output driver of claim 1, wherein the controller comprises additional circuitry for providing a precharge enable signal, wherein the precharge enable signal causes the first driver circuit to couple a precharge signal to the output of the output driver circuit.

7. The output driver of claim 1, wherein the controller comprises additional circuitry for providing a negate enable signal, wherein the negate enable signal causes the first driver circuit to actively drive the output of the output driver circuit to an inactive state during a predetermined bus interface phase.

8. The output driver of claim 1, further comprising:

differential output connection, wherein the differential output connection operably couples the output of the output driver to a differential peripheral bus, wherein the differential output connection provides differential output data on the differential peripheral bus in response to data received from the output driver.

9. An output driver circuit for a bus interface, the output driver circuit comprising:

first driver circuit, wherein the first driver circuit provides output data at a first current level to an output of the output driver circuit;

second driver circuit operably coupled in parallel to the first output driver, wherein the second driver circuit provides output data at a second current level to the output of the output driver circuit; and controller operably coupled to the first driver circuit and the second driver circuit, wherein the controller receives control signals and data signals, and wherein the controller dynamically controls the operation of the first driver circuit and the second driver circuit, wherein the controller provides a first enable signal to the first driver circuit to provide data to the output of the output driver circuit in a single ended mode of operation, and wherein the controller provides a second enable signal to the second driver circuit to provide data to the output of the output driver circuit in a differential mode of operation.

10. The output driver of claim 9, wherein the controller further comprises circuitry for providing a precharge enable signal to the first driver circuit, wherein the precharge enable signal causes the first output driver to couple a precharge signal to the output of the output driver circuit.

11. The output driver of claim 9, wherein the control circuit further provides a negate enable signal, wherein the negate enable signal causes the first output driver to actively drive the output of the output driver circuit to an inactive state during a predetermined bus interface phase.

12. A data processing system comprising:

a bus controller, wherein the bus controller includes an output driver having:

first driver circuit, wherein the first driver circuit includes a first transistor operably coupled between a first power supply and an output of the output driver, and wherein the first driver circuit includes a second transistor operably coupled between a second power supply and the output of the output driver;

second driver circuit, wherein the second driver circuit includes a first transistor operably coupled between the first power supply and an output of the output driver, and wherein the second driver circuit includes a second transistor operably coupled between the second power supply and the output of the output driver; and controller operably coupled to the first driver circuit and the second driver circuit, wherein the controller receives control signals and data signals, and wherein the controller dynamically controls the operation of the first driver circuit and the second driver circuit to cause the first driver circuit and the second driver circuit to provide the data at selected current levels based on the control signals from the controller of the output driver, wherein the controller includes circuitry for mutually exclusively enabling the first driver circuit and the second driver circuit;

a peripheral bus operably coupled to the bus controller; and at least one peripheral device operably coupled to the peripheral bus, wherein each peripheral device communicates with the bus controller over the peripheral bus through the output driver.

13. The data processing system of claim 12, wherein the at least one peripheral is selected from the group consisting of a compact disc (CD) drive, a floppy disk drive, a hard disk drive, a serial bus interface, a parallel bus interface, a printer, a tape drive, and an optical disc drive.

14. The data processing system of claim 12, further comprising:

a processor bus operably coupled to the bus controller;

a processor operably coupled to the processor bus, wherein the processor issues instructions to the bus controller over the processor bus, and wherein the processor receives data from the bus controller over the data bus;

memory operably coupled to the processor bus, wherein the memory stores configuration information and data.

15. A method for configuring an output driver of a bus interface, the method comprising the steps of:

(a) issuing a query instruction to at least one peripheral device connected to the bus interface over a peripheral bus;

(b) receiving query data over the peripheral bus in response to the query instruction, wherein the query data includes configuration information for the at least one peripheral device;

(c) determining a selected mode of operation of the output driver from a plurality of possible modes of operation based upon the query data;

(d) transmitting operation information to the at least one peripheral device, wherein the operation information is used to configure the at least one peripheral device for the selected mode of operation.

16. The method of claim 15, wherein in step (c), determining a mode of operation of the output driver based upon the query data includes determining a mode of operation of the output driver in conjunction with each peripheral device.

17. An output buffer allowing a central processing unit (CPU) to communicate with at least one peripheral devices, the output buffer comprising:

N driver circuits wherein N is a finite positive integer greater than one, each of the N driver circuits comprising one N channel transistor coupled between a power supply voltage and an output line, one N channel transistor coupled between a ground supply voltage and the output line, and wherein the output line is common to all of the N driver circuits, each of the N driver circuits driving output signals onto the output line in a manner that is unique when compared to the output driving performed by all other N driver circuits;

control logic coupled to the N driver circuits to select which one of the N driver circuits is to mutually exclusively drive the output line at a given time.

18. The output buffer of claim 17 wherein the output buffer is a Small Computer User Interface ("SCSI") bus used in a computer.

19. The output buffer of claim 17 wherein two of the N driver circuits are selected for operation in a substantially overlapping time period to transmit at least one bit of data.

20. A method for communicating SCSI information in a computer between a central processing unit (CPU) and both a first peripheral and a second peripheral, the method comprising the steps of:

polling the first peripheral to determine a first SCSI drive mode that the first peripheral is designed to use;

programming a driver, which is used by the CPU to communicate output data to the first peripheral, to operate in the first SCSI drive mode;

communicating SCSI information from the CPU to the first peripheral using the first SCSI drive mode via the driver;

polling the second peripheral to determine a second SCSI drive mode that the second peripheral is designed to use wherein the first SCSI drive mode is different from the second SCSI drive mode;

programming the driver, which is used by the CPU to communicate output data to the second peripheral, to operate in the second SCSI drive mode; and communicating SCSI information from the CPU to the second peripheral using the second SCSI drive mode via the driver.

21. The method of claim 15, further wherein selected mode of operation of the output driver is chosen as one of three modes wherein the three modes are included in the plurality of possible modes of operation, wherein in the first mode the output driver actively drives the peripheral bus to an inactive state, wherein in the second mode the output driver provides a pulse signal to precharge the peripheral bus towards an inactive state, and wherein the third mode only allows an external pull-up circuit to drive the peripheral bus towards the inactive state.

* * * * *